United States Patent [19]

Miyasaka et al.

[11] 4,310,924
[45] Jan. 12, 1982

[54] CHANNEL PROGRAMMING APPARATUS FOR A SIGNAL RECEIVER

[75] Inventors: Tomoaki Miyasaka; Toshio Amano, both of Tokyo, Japan

[73] Assignee: Sony Corporation, Tokyo, Japan

[21] Appl. No.: 109,337

[22] Filed: Jan. 3, 1980

[30] Foreign Application Priority Data

Jan. 11, 1979 [JP] Japan ................................. 54-2096

[51] Int. Cl.³ .............................................. H03J 5/24
[52] U.S. Cl. .................................... 455/181; 455/186
[58] Field of Search ............... 455/179, 181, 154, 171, 455/175, 183, 184, 185, 237, 231; 358/191, 192

[56] References Cited

U.S. PATENT DOCUMENTS

| | | | |
|---|---|---|---|
| 3,800,230 | 3/1974 | Marks | 455/181 |
| 3,806,819 | 4/1974 | Leonard | 455/179 |
| 4,031,470 | 6/1977 | Kokado et al. | 455/181 |
| 4,193,120 | 3/1980 | Yello | 455/179 |
| 4,206,483 | 6/1980 | Nakamura | 455/231 |

OTHER PUBLICATIONS

Frequency Synthesis Tuning Systems with Automatic Offset Tuning by Beyers et al. IEEE Transactions on Consumer Electronics, vol. CE-24, No. 3, Aug. 1978, pp. 419-428.
A Programmable TV Receiver, by Kokado et al., IEEE Transactions on Consumer Electronics, Feb. 1978, pp. 69-82.

*Primary Examiner*—Robert L. Richardson
*Assistant Examiner*—Tommy P. Chin

*Attorney, Agent, or Firm*—Lewis H. Eslinger; Alvin Sinderbrand

[57] ABSTRACT

A programming apparatus is provided for use with a signal receiver, such as a television or FM broadcast receiver, of the type whose tuning frequency is determined by a tuning control voltage or other tuning control signal, and whose power supply can be switched between an OFF and an ON condition in response to a power control signal. In the programming apparatus, a tuner control circuit generates a tuning control signal representing a predetermined channel or frequency when the power supply is switched to the ON condition; a timer generates a current time code representing the current time; a coincidence detector circuit compares the current time code with a program time code which is selectively entered and stored in a program time memory and provides a coincidence signal when these two codes are the same; a circuit applies the power control signal to the power supply to switch it to its ON condition upon occurrence of the coincidence signal; a program channel code corresponding to a desired channel or frequency is selectively entered and stored in a program channel memory; a discriminator provides a discriminating signal to indicate the stored presence of the program channel code in the program channel memory; and another circuit supplies the program channel code from the program channel memory to the tuner control circuit upon the occurrence of both the coincidence signal and the discriminating signal so that the tuner is tuned to the desired frequency at the desired program time.

7 Claims, 1 Drawing Figure

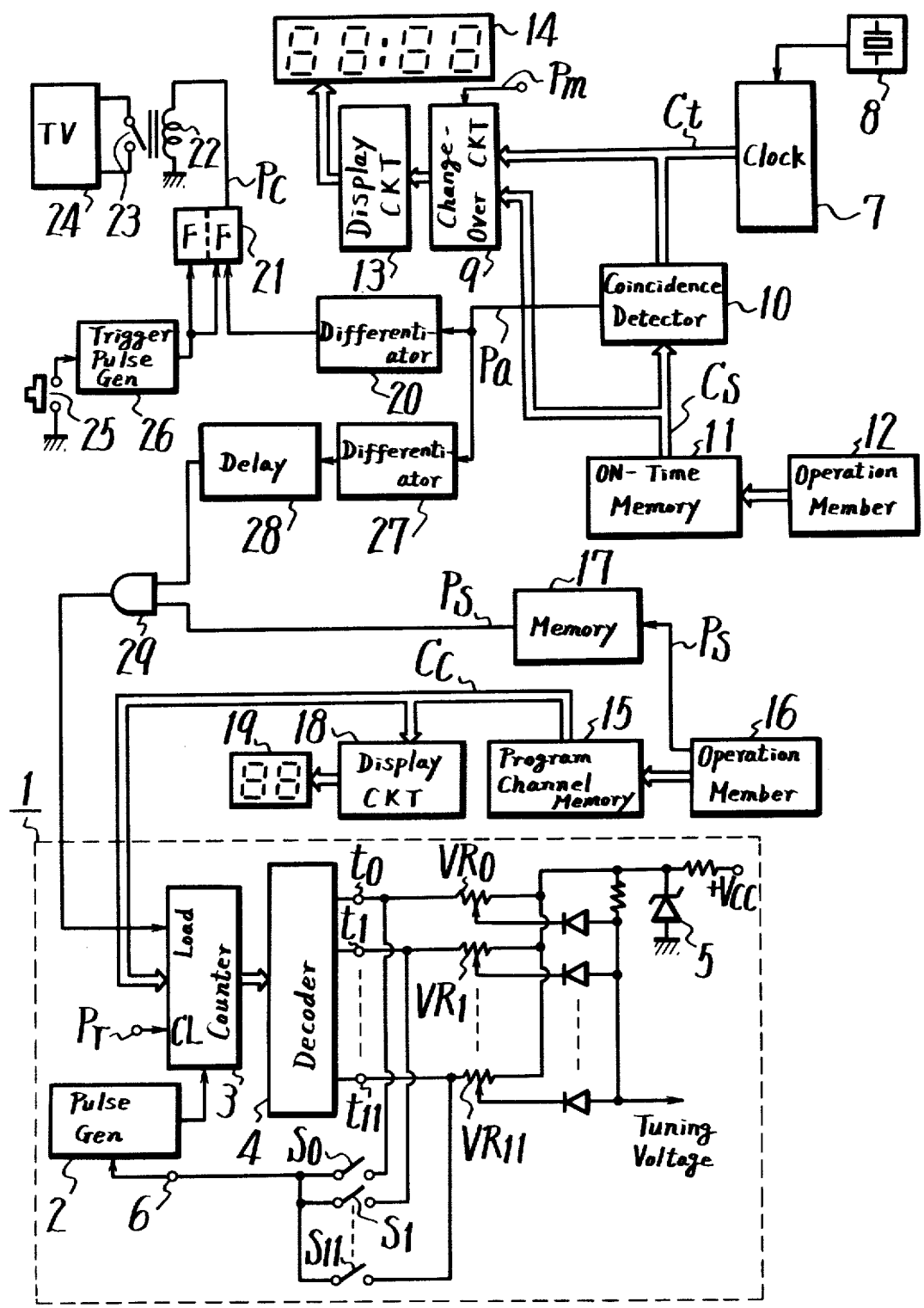

CHANNEL PROGRAMMING APPARATUS FOR A SIGNAL RECEIVER

BACKGROUND OF THE INVENTION

1. Field of the Invention

The present invention relates generally to a channel programming apparatus for a signal receiver, and more particularly to a channel programming apparatus for a signal receiver such as a television receiver, FM tuner or the like for programming a channel to be received at a predetermined time.

2. Description of the Prior Art

For conventional channel programming apparatus to function properly and to turn a signal receiver to a programmed channel at a desired time, it is necessary to preset both an ON-time corresponding to the time of the desired program, and a channel number corresponding to the desired program channel. If a user sets the ON-time without also setting the channel number, the channel programming operation is deemed erroneous and the receiver is not turned ON at the desired time. It is also necessary with such conventional apparatus to present a channel even when an OFF-time is set to shut the receiver OFF at a desired time.

OBJECTS AND SUMMARY OF THE INVENTION

Accordingly, one object of the present invention is to provide a novel channel programming apparatus for a signal receiver free of the defect encounted in the prior art.

Another object of the invention is to provide a channel programming apparatus for a signal receiver by which even if a user fails to set the channel number of a desired channel but does set a program ON-time, such programming operation is not deemed erroneous and hence at the predetermined ON-time the power supply of the signal receiver is turned ON and the signal receiver can receive a broadcast wave on a predetermined channel.

A further object of the invention is to provide a channel programming apparatus for a signal receiver which can reduce the consequences of faulty programming as compared with the prior art and simplifies the programming required to use the apparatus and its associated signal receiver as an alarm.

According to an aspect of this invention, a programming apparatus is provided for use with a signal receiver, such as a television or FM broadcast receiver, of the type whose tuning frequency is determined by a tuning control voltage or other tuning control signal and whose power supply can be switched, for instance, from an OFF condition to an ON condition, in response to a power control signal. Such programming apparatus comprises a tuner control circuit for generating the tuner control signal when the power supply is switched to said ON condition and which has a predetermined characteristic so as to represent a predetermined frequency; a timer for generating a current time code representing the current time; a first input circuit for selectively generating a program time code representing a desired program time; a first memory for storing the program time code; a coincidence detector for comparing the current time code with the program time code stored in the first memory and providing a coincidence signal when the current time code and the stored program time code are the same or bear a predetermined relation to one another; a circuit responsive to the occurrence of the coincidence signal for applying the power control signal to the power supply to switch it into one of its ON and OFF conditions; a second input device for selectively generating a program channel code corresponding to a desired frequency; a second memory for storing the program channel code; a discriminator for providing a discriminating signal indicating the stored presence of the program channel code in the second memory; and a circuit for supplying the program channel code from the second memory to the tuner control circuit upon occurrence of both the coincidence signal and the discriminating signal, so that the tuner is tuned to the desired frequency at the desired program time.

Other objects, features, and advantages of the present invention will become apparent from the following description taken in conjunction with the accompanying drawing.

BRIEF DESCRIPTION OF THE DRAWING

The attached FIGURE is a block diagram showing an example of the present invention.

DESCRIPTION OF THE PREFERRED EMBODIMENT

With reference to the drawing, an example of present invention will be hereinafter described in which the invention is applied to a television receiver.

In the FIGURE, a tuner control apparatus indicated as a dotted-line block 1 controls the tuning of a television receiver 24. In the tuner control apparatus 1, there is included a pulse generator 2 whose output is applied to a binary counter 3 which provides a parallel output (for example a four-bit code), to a decoder 4, here shown as having twelve output terminals t0, t1 ... t11. The output terminals t0, t1 ... t11 are set, one at a time, and in cyclical order, at ground potential in accordance with the output from the counter 3 while the remaining output terminals remain set at a predetermined DC potential. When the contents of the counter 3 are "0", only the output terminal t0 becomes set at ground potential. Between the respective output terminals t0 to t11 of the decoder 4 and the cathode of a Zener diode 5, these are connected resistive elements of variable resistors VR0, VR1, ..., VR11 each of which serves to produce a tuning voltage at its wiper. The Zener diode 5, assures that a predetermined DC voltage appears at the end of the resistive elements of variable resistors VR0 to VR11 remote from the decoder 4. The wipers of variable resistors VR0 to VR11 are each preset that they generate appropriate tuning voltages for receiving different respective channels. For example, when the output terminal t0 of the decoder 4 becomes grounded, the variable resistors VR0 produces such a first predetermined tuning voltage to receive a channel. The output terminals t0 to t11 of the decoder 4 are connected to first ends of push-button tuning switches S0, S01, ..., S11, respectively, whose second ends are connected together to a control terminal 6 of the pulse generator 2. This pulse generator 2 produces a pulse which commences when the control terminal 6 is at a predetermined DC potential, but which ceases when the control terminal 6 returns to the ground level. Accordingly, the pulse generator 2 continues to produce its pulse until the output terminal of the decoder 4, which is connected to that one of the tuning switches S0 to S11 which is made ON, is at ground potential. Hence, a channel can be selected by the tuning switches S0 to S11.

The tuning voltage thus generated in the tuner control apparatus 1 is applied to a variable capacitance diode (not shown) provided in a tuning circuit of a local oscillator or the like of a tuner (not shown) in the television receiver 24. Further, a clear terminal CL of the counter 3 in the tuner control apparatus 1 is supplied with a clear pulse Pr which is generated when the power switch of the television receiver is turned ON. Thus, at the time when the power switch of the television receiver is turned ON, the first predetermined channel is received by the television receiver.

A clock circuit 7 is supplied with a reference signal from a reference oscillator 8. The clock circuit 7 here includes a frequency divider which frequency-divides the reference signal and counters which generate a time code Ct formed of one-minute, ten-minute, and one-hour units. This time code Ct is supplied to a coincidence detector circuit 10.

An ON-time memory 11 is provided with counters similar to those in the clock circuit 7 for storing one-minute, ten-minute, and one-hour units, and this memory 11 is arranged to store a ON-time code Cs representing the desired program time. The ON-time code Cs is set by operating the key of an operation member 12 which is provided wth a mode change-over switch and separate adjusting switches for determing the respective one-minute, ten-minute, and one-hour units. The ON-time code Cs is supplied to the coincidence detector circuit 10 and also to a change-over circuit 9. This change-over circuit 9 is connected to a display circuit 13 which applies a display signal to a display member 14. The display member 14 in this example has four figure display patterns (each of which has seven segments arranged in a figure-eight shape) for displaying the hour and also has dot-shaped minute and display segments for separating the displays of the hour and minute. The display member 14 can be any convenient device, such as a display tube, light emission diode, liquid crystal or the like. The change-over circuit 9 is controlled by a mode signal Pm. When program mode is selected by the key operation of the operating member 12, the ON-time code Cs is selected by the change-over circuit 9 and the selected ON-time is displayed on the display member 14. In the other modes, the time code Ct is selected by the change-over circuit 9 and the current time is displayed on the display member 14.

A program channel memory 15 program channel memory which consists of, for example, a counter, is provided to store program channel selection information. An operating member 16 is also provided for a user to write the program channel selection information into the program channel memory 15. The operating member 16 has a set of key switches for entering a program channel code Cc to be stored in the program channel memory 15. The operating member 16 also furnishes a discrimination signal Ps, which becomes "1" when the program channel code Cc is being written into the program channel memory 15, is stored in a memory 17. This discrimination signal Ps can be generated by operating a special key switch provided in the operation member 16 or by sensing the completion of the program channel code Cc. A flip-flop circuit can serve as the memory 17. The program channel code Cc is fed to a display circuit 18 which causes the channel number corresponding to the selected program channel to be displayed on a channel display member 19. Alternatively, the channel display member 16 can be omitted, and the number of the selected channel can be displayed on the display member 14 at the time a channel is being selected by operating member 16.

The coincidence detector circuit 10 provides a detected output Pa which attains a high level ("1") at the time that the time code Ct coincides with the ON-time code Cs. The detected output Pa is supplied through a differentiation circuit 20 to a flip-flop circuit 21 to trigger the latter by means of a pulse from the differentiation circuit 20 representing the positive-going edge of the pulse Pa. As a result, the flip-flop circuit 21 provides an output Pc which becomes "1" at that time. A relay winding 22 is connected between the output terminal of flip-flop circuit 21 and the ground so that when the output Pc becomes "1", the relay winding 22 is energized and hence is relay contact 23 closes, thereby connecting the power supply the television receiver 24. The receiver is turned ON and OFF by operation the relay contact 23. That is, when the relay contact 23 closes, the power switch of the television receiver 24 is turned ON, while when the former opens the latter is turned OFF. The power switch or power supply to the respective circuit of the tuner control apparatus 1 is also connected and disconnected by relay contact 23, but the other circuits, such as the clock circuit 7, are separately powered so as to be supplied with power even when the relay contact 23 opens. A power source switch 25 here shown as a push-button, and a trigger pulse generator are also provided. When the power source switch 25 is actuated, the trigger pulse generator 26 produces a trigger pulse which is supplied to the flip-flop circuit 21 to change its state, so that the receiver 24 can be turned ON and OFF directly.

The detected output Pa from the coincidence detector circuit 10 is also supplied through a second differentiating circuit 27 and a delay circuit 28 to one input of an AND gate 29. The output side of the delay circuit 28 provides a positive pulse at a time somewhat delayed from the time of the positive-going edge of the detected output Pa. The discrimination signal Ps held in the memory 17 is applied to another input of the AND gate 29 and the output of the latter is supplied as a load signal to a load terminal of the counter 3 in the tuner control apparatus 1. Upon reception of the load signal by the counter 3, the program channel code Cc held in the program channel memory 15 is loaded into the counter 3 and determines its contents which, in turn, preset the decoder 4 to the output thereof t0, t1 . . . t11 corresponding to the programmed channel.

In the above-described embodiment of this invention, it is assumed a desired ON-time is set by operation of the operation member 12, while at the same time a desired channel is programmed by operation of the operation member 16, so that the predetermined ON-time code Cs and the predetermined program channel code Cc are stored in the ON-time memory 11 and in the program channel memory 15, respectively. Hence, the discriminating signal Ps held in the memory 17 is "1". When the detected output Pa from the coincidence detector circuit 10 rises at the predetermined ON-time, the output Pc from the flip-flop circuit 21 becomes "1" in response to the positive-going edge of the detected output Pa, the relay contact 23 closes, and hence the power switch of the television receiver 24 is made ON. After a time somewhat delayed from the positive-going edge of the detected output Pa, a positive pulse is delivered from the AND gate 29. Thus, the program channel code Cc is loaded in the counter 3 of the tuner control apparatus 1, the output terminal of the decoder 4 determined by the program channel code Cc attains a ground level, or "0", and accordingly the desired program channel will be received. In this example, the delay circuit 28 is provided to avoid an unstable or determinate state upon the actuating of the power source and to delay the output from the AND gate 29 "1" behind the clear pulse Pr.

If, in contrast to operation, the ON-time is set but the selection of a program channel is omitted, whether accidentally or intentionally, the discriminating signal Ps is "0". Accordingly, at the set ON-time, the output of the AND gate 29 remains "0" and, consequently, the output from the program channel memory 15 (in this case, a meaningless output) is not loaded in the counter 3. However, since the contact 23 is closed and the power switch is turned ON, the clear pulse Pr is generated, the counter 3 is cleared and one of the channels, for example, the first channel, determined by the variable resistor VR0 is received by the television receiver 14.

As described above, according to the present invention, if an ON-time is set, but a program channel is not set, a predetermined channel determined by the construction of the tuner control apparatus 1 will be received at the set ON-time. Therefore, as compared with the prior art apparatus in which the setting of an ON-time without a simultaneous setting of a program channel is deemed as an erroneous operation, the present invention can ease the consequences of operator error. Further, when a television receiver, for example, provided with the present invention is used as an alarm, so that the setting of a particular program channel is rather unimportant, the process of programming can be simplified.

Instead of the above example of the tuner control apparatus 1, another type of tuner control apparatus could be employed, in which the variable resistors VR0 to VR11 are omitted, and a plurality of code signals are stored in a random access memory. When a programmed channel is to be selected. The code signal is selectively read out from the random access memory by addressing its storage location, and the read-out code signal is converted from digital to analog form to produce a tuning voltage. In this case, the random access memory is made as a non-volatile memory to hold its contents even when the power switch is turned OFF, and when the power switch is made ON, the code signal corresponding to a predetermined channel (for example the first, channel) or a channel selected just before the power switch was turned OFF, is read out. If the present invention is to be applied when the tuner control apparatus is arranged as described above, the output from the AND gate 29 is used to preset a program channel code for addressing the memory location, in the random access memory of the desired channel.

Further, the present invention can be applied to a television receiver or to an FM receiver having as its tuner apparatus a frequency synthesizer system using a PLL (phase locked loop) circuit. In such a receiver, the program channel code is used as a control signal which will determined the frequency dividing ratio of a programmable variable frequency divider.

It is of course also possible according to this invention to preset an OFF-time as well as the ON-time. Further, the timer circuit need not utilize the exact clock 7 and display circuit 13 described above, but the timer can be of any conventional design.

It will be apparent that many modification and variations can be effected by one skilled in the art without departing from the spirit or scope of the novel concepts of the present invention, which is to be determined by the appended claims only.

We claim as our invention:

1. Programming apparatus for a signal receiver of the type having a tuner whose frequency is determined by a tuning control signal, and a power supply having an ON and an OFF condition and which can be switched from one to the other of said ON and OFF conditions in response to a power control signal, the programming apparatus comprising:

tuner control means for generating said tuning control signal when said power supply is switched to said ON condition, said tuning control signal having a predetermined characteristic for representing the frequency of the tuner;

timing means for generating a current time code representing the current time;

first input means for selectively generating a program time code representing a desired program time;

first memory means for storing said program time code;

coincidence detector means for comparing the current time code with the program time code stored in said first memory means and providing a coincidence signal when said current time code and the stored program time code bear a predetermined relation to one another;

means for applying said power control signal to said power supply to switch it into one of said ON and OFF conditions in response to an occurrence of said coincidence signal;

second input means for selectively generating a program channel code corresponding to a desired frequency;

second memory means for storing said program channel code;

means providing a discriminating signal indicating the stored presence of said program channel code in said second memory means;

means for supplying said program channel code from said second memory means to said tuner control means so that said tuning control signal has said characteristic determined for tuning said tuner to the desired frequency at the desired program; and logic circuit means coupled to received said coincidence signal and said discriminating signal and permitting said tuner control means to receive said program channel code only upon occurance of both said coincidence signal and said discriminating signal at input terminals of said logic circuit means.

2. Programming apparatus according to claim 1; wherein said means for applying said power control signal to said power supply includes a flip-flop circuit having an output and a switching input and being switchable between first and second states, means coupling the output of said flip-flop circuit to said power supply to switch the latter into one of said ON and OFF conditions when said flip-flop circuit is in its first state, and means coupling said coincidence detector means to the switching input of said flip-flop circuit so that the latter is switched from its second state to its first state upon occurrence of said coincidence signal.

3. Programming apparatus according to claim 1; wherein said tuner control means includes loadable counter means having a data input coupled to receive the program channel code stored in said second memory means; a load signal input, and a plurality of outputs each corresponding to a predetermined frequency and each of which corresponds to a count attainable in said loadable counter means; and said logic circuit means applies a load signal to said load signal input upon occurrence of both said coincidence signal and said discriminating signal so that said program channel code stored in said second memory means is loaded into said loadable counter means upon such occurence.

4. Programming apparatus according to claim 3; wherein said logic circuit means includes a logic gate having two input terminals and an output terminal, and delay means providing a delayed signal corresponding to said coincidence signal; and wherein one of said input terminals of said logic gate is coupled to receive said delayed signal, the other of said input terminals is coupled to receive said discriminating signal, and said output terminal is coupled to said load signal input to provide to the same a load signal upon simultaneous occurrence of said delayed signal and said discriminating signal.

5. Programming apparatus according to claim 4; wherein said loadable counter means includes a clear terminal, and a clear signal is applied to said clear terminal to clear said counter means whenever said power supply is switched into said ON condition.

6. Programming apparatus according to claim 1; wherein said logic circuit means includes a logic gate having input terminals and an output terminal, one of said input terminals being connected to receive said coincidence signal, another of said input terminals being connected to receive a version of said coincidence signal, and said output terminal being connected to said tuner control means to provide thereto the tuning control signal upon occurrence of both said coincidence signal and said discriminating signal.

7. Programming apparatus according to claim 5; wherein said logic gate is an AND gate.

* * * * *